(12) United States Patent
Van Dijk et al.

(10) Patent No.: US 6,362,754 B1
(45) Date of Patent: Mar. 26, 2002

(54) METHOD OF DECODING A STREAM OF CHANNEL BITS OF A SIGNAL RELATING TO A BINARY CHANNEL SIGNAL INTO A STEAM OF SOURCE BITS OF A SIGNAL RELATING TO A BINARY SOURCE SIGNAL

(75) Inventors: Marten E. Van Dijk; Willem M. J. M. Coene; Constant P. M. J. Baggen, all of Eindhoven (NL)

(73) Assignee: U.S. Philips Corporation, New York, NY (US)

( * ) Notice: Subject to any disclaimer, the term of this patent is extended or adjusted under 35 U.S.C. 154(b) by 0 days.

(21) Appl. No.: 09/527,204

(22) Filed: Mar. 16, 2000

(30) Foreign Application Priority Data

Mar. 23, 1999 (EP) ............................................. 99200873
Jun. 28, 1999 (EP) ............................................. 99202061

(51) Int. Cl.⁷ ............................................... H03M 7/00
(52) U.S. Cl. ......................................... 341/59; 714/793
(58) Field of Search ............................ 341/59, 123, 94, 341/120, 39; 370/226, 228, 243, 496; 714/793, 757, 783; 340/825.69; 375/295; 369/47.53

(56) References Cited

U.S. PATENT DOCUMENTS

| 5,072,435 | A | * | 12/1991 | Bakx ........................ 369/47.53 |
| 5,115,438 | A | * | 5/1992 | Friederichs et al. ........ 714/793 |
| 5,136,436 | A | * | 8/1992 | Kahlman ...................... 341/59 |
| 5,140,474 | A | * | 8/1992 | Kahlman et al. .............. 341/39 |
| 5,142,421 | A | * | 8/1992 | Kahlman et al. .............. 341/59 |
| 5,150,113 | A | * | 9/1992 | Bluthgen ................ 340/825.69 |
| 5,175,510 | A | * | 12/1992 | Kuban et al. ................ 714/783 |
| 5,243,343 | A | * | 9/1993 | Moriyasu ..................... 341/123 |
| 5,642,113 | A | | 6/1997 | Schouhamer Immink .... 341/58 |
| 5,696,505 | A | * | 12/1997 | Schouhamer Immink .... 341/59 |
| 5,699,413 | A | * | 12/1997 | Sridhar ........................ 370/496 |
| 5,943,368 | A | * | 8/1999 | Bergmans et al. ........... 375/295 |

FOREIGN PATENT DOCUMENTS

| EP | 0866454 A2 | 9/1998 | ............ G11B/20/00 |
| GB | 2083322 A | 3/1982 | ........... H03K/13/24 |
| WO | WO9735304 | 9/1997 | ............ G11B/7/007 |

* cited by examiner

Primary Examiner—Peguy JeanPierre
Assistant Examiner—Jean Burner JeanGlaude
(74) Attorney, Agent, or Firm—Michael E. Belk

(57) ABSTRACT

A stream of channel bits, of a signal relating to a binary channel, is decoded into a stream of source bits, of a signal relating to a binary source. This binary channel includes a main channel and a secondary channel. This secondary channel is embedded in the main channel. Errors in the stream of secondary channel bits are corrected using a stream of corrected main channel bits. This stream of corrected main channel bits is reconstructed from a stream of corrected source bits. The secondary channel can be embedded in the main channel in different manners, e.g. via multi-level coding or via merging-bit coding.

23 Claims, 6 Drawing Sheets

| Classification of Merging-Bit Patterns —— $10^n \mid xyz \mid 0^m 1$ —— in EFM | | | | | | | | | |
|---|---|---|---|---|---|---|---|---|---|
| | n=0 | n=1 | n=2 | n=3 | n=4 | n=5 | n=6 | n=7 | n=8 |
| m=0 | X | X | DC | DC | DC | DC | DC | DC | X |
| m=1 | X | DC | H3 | H3 | H3 | H3 | H3 | 2 | 2 |
| m=2 | DC | H3 | 4 | 4 | 4 | 4 | 3 | 3 | 3 |
| m=3 | DC | H3 | 4 | 4 | 4 | 3 | 3 | 3 | 3 |
| m=4 | DC | H3 | 4 | 4 | 3 | 3 | 3 | 3 | 3 |
| m=5 | DC | H3 | 4 | 3 | 3 | 3 | 3 | 3 | 3 |
| m=6 | DC | H3 | 3 | 3 | 3 | 3 | 3 | 3 | 3 |
| m=7 | DC | 2 | 3 | 3 | 3 | 3 | 3 | 3 | 3 |
| m=8 | X | 2 | 3 | 3 | 3 | 3 | 3 | 3 | 3 |

FIG. 6

METHOD OF DECODING A STREAM OF CHANNEL BITS OF A SIGNAL RELATING TO A BINARY CHANNEL SIGNAL INTO A STEAM OF SOURCE BITS OF A SIGNAL RELATING TO A BINARY SOURCE SIGNAL

FIELD OF THE INVENTION

The invention relates to the field of optical recording and is most closely related to channel decoding signals read from optical media.

BACKGROUND OF THE INVENTION

The invention relates to a method of decoding a stream of channel bits of a signal relating to a binary channel into a stream of source bits of a signal relating to a binary source.

The invention also relates to a device for decoding a stream of channel bits of a signal relating to a binary channel into a stream of source bits of a signal relating to a binary source, which device comprises decoding means conceived to decode a main channel.

The invention is applicable to record carriers with different kinds of channel codes. In a channel code source bits are encoded to channel bits according to a predetermined scheme. The information stored on these record carriers can be coded, for example, in accordance with a runlength-limited (RLL) code. A RLL code is characterized by two parameters, (d+1) and (k+1), which stipulate the minimum and maximum runlengths, respectively, that may occur in the code. The length of time usually expressed in channel bits between consecutive transitions is known as the runlength. Such a transition can for example be a transition from a pit-mark to a land-mark, e.g. in CD-DA, CD-R, or a transition from an amorph domain to a crystalline domain, e.g. in CD-RW.

The functioning of a method mentioned in the foregoing can be understood from UK Patent Application GB 2 083 322 (PHQ 80007). This document describes a device for decoding a stream of channel bits into a stream of source bits. In this case, the binary channel signal to be decoded is runlength-limited. This stream of channel bits is obtained by reading a record carrier with a focused laser beam, as is typical for optical record carriers. Using this RLL code and this reading technique results in record carriers with a reasonably high capacity. In UK Patent Application GB 2 083 322 the channel code called EFM, employed in the Compact Disc Digital Audio standard, is disclosed.

However, under the conditions of the beam spot diameter (depending on the NA of the objective lens used) and the wavelength of the present laser beam, the capacity of the record carrier cannot be increased when keeping identical detection margins.

Those skilled in the art are hereby directed to U.S. Pat. No. 5,642,113 by Schouhamer, European Publication EP 0866454, and International Publication WO 97/35304.

The above citations are hereby incorporated in whole by reference.

SUMMARY OF THE INVENTION

The invention has for an object to increase the data capacity of a record carrier under the conditions mentioned above.

In this invention, the capacity of the record carrier is increased by addition of a secondary channel on top of a main channel and by providing a reliable detection of this secondary channel. The main channel is a binary channel where pits and non-pits (lands) are related to two possible signal levels (below and above a threshold level).

The method in accordance with the invention is characterized in that the binary channel comprises a main channel and a secondary channel, the secondary channel being embedded in the main channel, and that a stream of corrected main channel bits is used for correcting errors in the stream of secondary channel bits.

The invention is based on the recognition that errors in the stream of bits of the binary channel relating to the secondary channel are correlated with the marks of the main channel. In order to correct these errors, the stream of error-corrected bits of the binary source relating to the main channel must be re-encoded into the stream of error-corrected bits of the binary channel relating to the main channel.

When establishing this interaction between error-correction of the main channel and error correction of the secondary channel, a reliable secondary channel is created. It should be noted that the secondary channel exists by virtue of the main channel due to its hierarchical structure.

By embedding a secondary channel extra capacity can be generated on top of the capacity of the main channel. When reading out a record carrier comprising a secondary channel a traditional player can only see the information stored in the main channel, while enhanced player, equipped with means for reading out and decoding the secondary channel, can also see the information stored in the secondary channel.

Another method in accordance with the invention is characterized in the stream of corrected main channel bits is reconstructed from a stream of corrected source bits.

Another method in accordance with the invention is characterized in that the secondary channel is embedded in the main channel via multi-level coding.

Multi-level coding can be achieved in different ways. With multi-level coding is meant the coding which uses the different levels of the read-out signal, obtained when reading out a record carrier, to decode the data. These different levels of the read-out signal can for example be accomplished by changing the geometry of a pit or mark to be read out from the record carrier. This change in geometry can be of different kinds, variation of the width, depth, the number of width or depth variations etc. A physical parameter of the secondary channel can be used for multi-level coding, e.g. a so-called "peanut"-structure can be made, or the depth and/or width of the pits and marks can be varied.

Another method in accordance with the invention is characterized in that the secondary channel is embedded in the main channel via merging-bit coding.

In channel coding source bits are encoded to channel bits. In some channel codes, merging bits are inserted between the channel bits in order to be able to influence some properties of a modulated channel signal comprising the channel bits. Using merging-bits, for example the DC-content of the modulated channel signal, formed by concatenating the encoded channel bits, can be controlled. In merging-bit coding part of the freedom that is offered in the choice of the merging bits is used. Some of the merging-bit patterns will be used for DC-control, the others will be used for the generation of extra capacity.

Another method in accordance with the invention, wherein the binary channel comprises merging-bits forming merging-bit patterns of a first and of a second class, is characterized in that the merging-bit patterns of the first class are used for influencing a property of the binary channel, and the merging-bit patterns of the second class are used for creating the secondary channel.

This method is based on the insight that not all merging-bit patterns are equally suited for influencing the properties of the binary channel. Therefore, a distinction is made between merging-bit patterns of a first class that are better to be used for DC-control, and merging-bit patterns of a second class that are better to be used for extra capacity in the merging-bit channel.

Another method in accordance with the invention is characterized in that the multi-level coding is only applied for a predetermined minimum runlength.

The parameter $n_{min}$, which indicates this minimal runlength for which the secondary channel is created, is chosen to be such that normal timing recovery in the main channel is not affected (it should therefore be noted that the record carrier with the multi-level coded pits and marks can still be read with a conventional decoder). For example, for DVD, a reasonable value for $n_{min}$ is 6, since the equalized eye-pattern under DVD-conditions reaches saturation (i.e. maximum amplitude level for land-marks and minimum amplitude for pit-marks) already for I6-runlengths. Apart from the main channel, which carries information in the occurrence of runlengths, extra capacity is available in the amplitude level of longer runlengths (the secondary channel). The secondary channel is hierarchically dependent on the main channel, since bits relating to this secondary channel can only be accommodated at those locations in the channel bit stream, where the main channel coding uses longer runlengths. This secondary channel is realized via limited multi-level (LML) coding. The limitation consists of the choice that multi-level coding is only applied for runlengths $In_{min}$ or greater, in which $n_{min}$ is a predetermined value.

Another method in accordance with the invention is characterized in that a physical parameter of a reconstructed signal corresponding to the stream of corrected main channel bits is used for correcting errors in the stream of secondary channel bits.

In order to create a reliable secondary channel, errors in the stream of secondary channel bits must be corrected. Error correction for the stream of secondary channel bits consists of two stages. The first stage concerns bit-deletion and bit-insertion errors in the secondary channel that are caused by transition-shift channel errors of the main channel. The second stage concerns the more usual type of bit-flip errors, for which a standard error-correction procedure (e.g. using Reed-Solomon error-correcting codes) can be applied. The first stage of error-correction for the secondary channel is the concern of the present invention. It is advisable to use a physical parameter of the stream of bits of the binary channel relating to the main channel to accomplish this correction. After error-correcting the main channel and re-coding the stream of corrected source bits of the main channel into a stream of channel bits for the main channel, the stream of bits of the binary channel relating to the main channel is thought to be correct. Therefore, the physical parameters of this channel are thought to be correct.

Another method in accordance with the invention is characterized in that the physical parameter is the runlength.

During the detection of the stream of bits of a binary channel signal, errors may lead to erroneous runlengths in the main channel bitstream, i.e. detected runlengths may be different from encoded runlengths. Therefore, it is first assumed that each runlength carries a potential secondary channel bit, and secondary channel detection is performed on each runlength. Note that an actual secondary channel bit is detected only if the encoded runlength In is not smaller than $In_{min}$.

Another method in accordance with the invention is characterized in that the secondary channel is split up into a secondary pit channel and a secondary land channel.

Another method in accordance with the invention is characterized in that erasure information from the main channel is used for correcting errors in the stream of bits of the binary channel relating to the secondary channel.

By using erasure information from the main channel when correcting errors in the stream of bits of the binary channel relating to the secondary channel, the traditional error-correction of the secondary channel (referred to before as the second stage of error-correction for the secondary channel) can be improved. Erasure information is information indicating the presence of possible errors in the bitstream and is generated during the error-correction of the main channel. The number of errors which can be corrected by the second stage of error-correction for the secondary channel is increased, using this erasure information.

The device in accordance with the invention is characterized in that said decoding means are also conceived to decode a secondary channel, the secondary channel being embedded in the main channel via multi-level coding, and that said decoding means are also conceived to correct errors in the stream of bits of the binary channel relating to the secondary channel using a stream of corrected bits of the binary channel relating to the main channel.

Another device in accordance with the invention is characterized in that the device further comprises reading means for reading a record carrier.

This device also comprises reading means. When reading a record carrier, the stream of bits of a binary channel signal is obtained.

BRIEF DESCRIPTION OF THE DRAWINGS

Other alternatives and advantages of the inventions herein will be disclosed or become obvious to those skilled in the art by studying the detailed description below with reference to the following drawings which illustrate the elements of the appended claims of the inventions.

FIG. 6 shows an embodiment of the classification of merging-bit patterns,

DETAILED DESCRIPTION OF THE PREFERRED EMBODIMENTS

Figure 1:
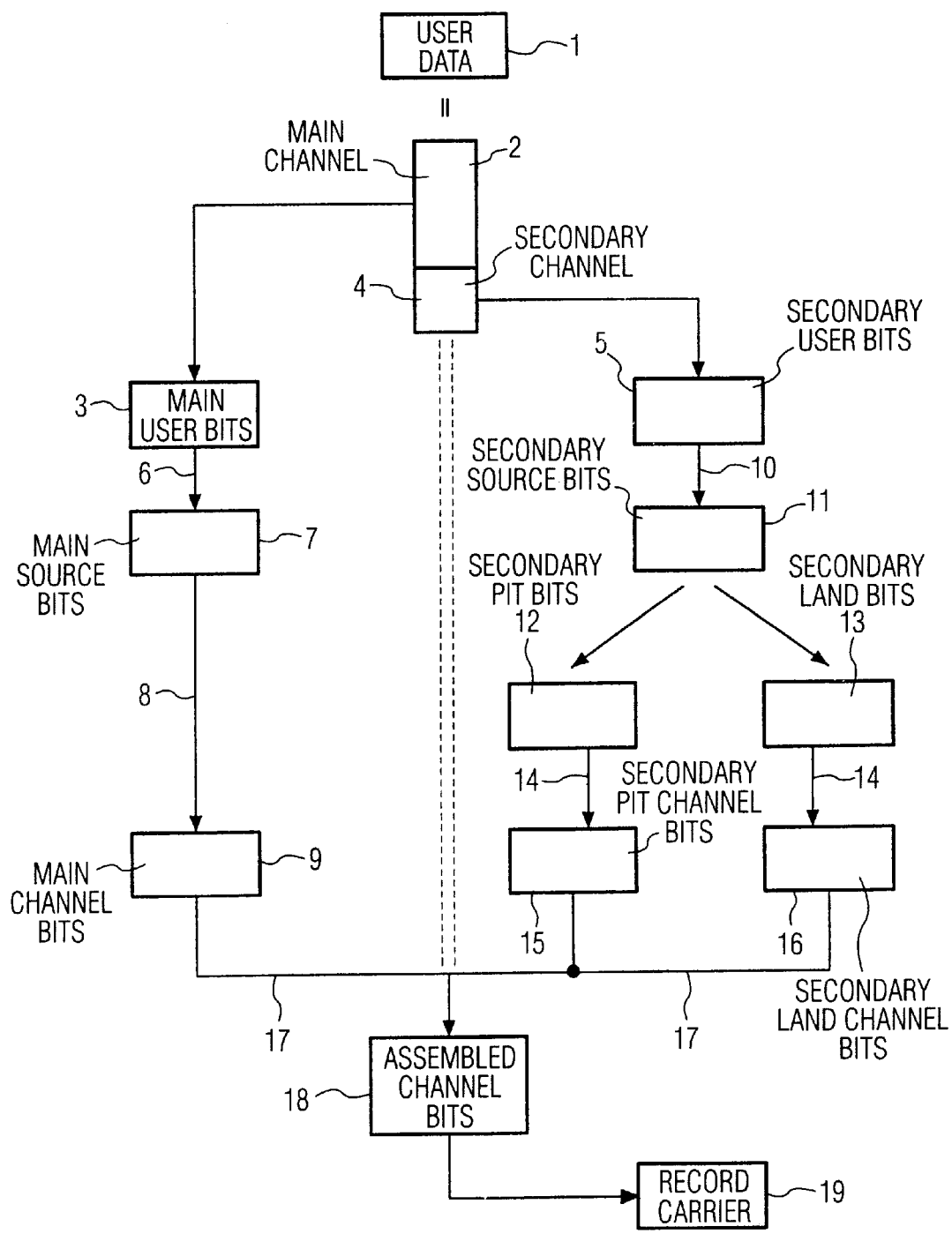
FIG. 1 shows an embodiment of an encoding method.

FIG. 1 shows an embodiment of an encoding method. User data 1 is partitioned between the main channel 2, comprising main user bits 3, and the secondary channel 4, comprising secondary user bits 5. In step 6, error correction is applied on the main user bits 3, yielding main source bits 7. These main source bits 7 comprise user data and parities generated in step 6. In step 8, encoding of the main source bits 7 yields the main channel bits 9 without the amplitude information. The encoding in step 8 can be accomplished, for example, via a standard RLL channel code, e.g. EFM+, well known to a person skilled in the art. Different information carrier use as a channel code an RLL channel code, e.g. different DVD-formats, like DVD-RAM, DVD+RW or DVD-RW use a (d=2, k=10) RLL EFM+ code.

In step 10, error correction is applied on the secondary user bits 5, yielding secondary source bits 11. These secondary source bits 11 comprise user data and parities generated in step 10. The secondary source bits 11 are further split into a secondary pit channel 12, with secondary pit bits and a secondary land channel 13, with secondary land bits. In step 14, a d=0 DC-free channel code is used for encoding both channels to generate secondary pit channel bits 15 and secondary land channel bits 16. An example of such a d=0 channel code is the 8-to-9 d=0 code as can be found in U.S. Pat. No. 5,642,113 (PHN 14789). The DC-free property of the code used for encoding is needed in order to retrieve (during the secondary channel detection) the slicer level from the measured waveform for detection of the secondary bits.

The secondary channel bits yield the amplitude information to be incorporated in the waveform that is to be generated from the secondary channel bitstream. In step 17, the main channel bits 9, the secondary pit channel bits 15 and the secondary land channel bits 16 are combined to the assembled channel bits 18. These assembled channel bits 18 are then written on a record carrier 19.

When writing the assembled channel bits on the record carrier, the multi-level coding is only applied for runlengths $In_{min}$ or greater, in which $In_{min}$ is a predetermined value. This multi-level coding can be performed in different ways. For example, the pits and lands can be mastered in a so-called "peanut"-structure which is realized by turning off the laser at a predetermined place and for a predetermined time in the case of a pit and by turning on the laser at a predetermined place and for a predetermined time in the case of a land. Also a narrower pit structure can be used for multi-level coding. The method according to the invention is not limited to multi-level coding of a particular kind. In the present embodiment, limited multi-level coding is used, but the method according to the invention is not limited to this so-called limited-level coding. More information about multi-level coding can be found in European Patent Application EP 0 866 454 A2 and International Publication WO 97/35304.

The secondary channel 2 is dependent on the main channel 4 due to the linking of the secondary amplitude effect with the longer runlengths. The detection problem caused by the hierarchy between main and secondary channels will be explained for the case $In_{min}$=6. Suppose, for instance, that a channel error occurred in the main channel (a simple transition shift) which turned an I5 into an I6. The first run does not carry an additional bit, whereas the second one does. Therefore, straightforward detection of the secondary channel yields a bit insertion. A bit deletion takes place when an I6 is turned into an I5 during RLL detection. In fact, simple transition shifts in the RLL channel can lead to bit slips (bit insertions and bit deletions) in the LML channel. This is further explained with reference to FIG. 2.

Figure 2A:
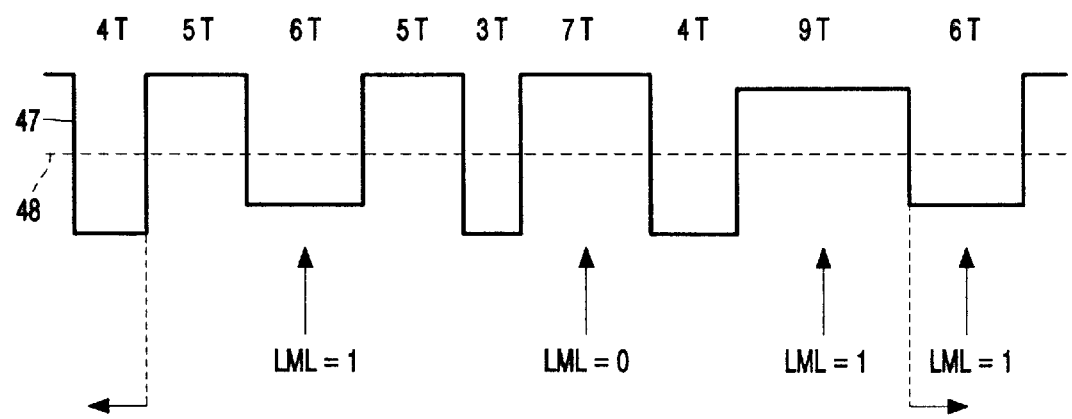
FIGS. 2A and 2B shows the presence and origin of bit slips in the secondary channel.

FIG. 2 shows the presence and origin of bit slips in the secondary channel. In FIG. 2a, an original RLL sequence 47 is shown with runlengths 4T, 5T, 6T, 5T, 3T, 7T, 4T, 9T and 6T, as is indicated in this Figure above the sequence 47. The dashed line 48 indicates the normal slicer level used for detection of the main channel. LML=0 and LML=1 under the sequence 47 indicate what sort of secondary/LML-source bit is present in the indicated runlength. The meaning of LML=0 and LML=1 is explained using FIG. 3.

Figure 3:
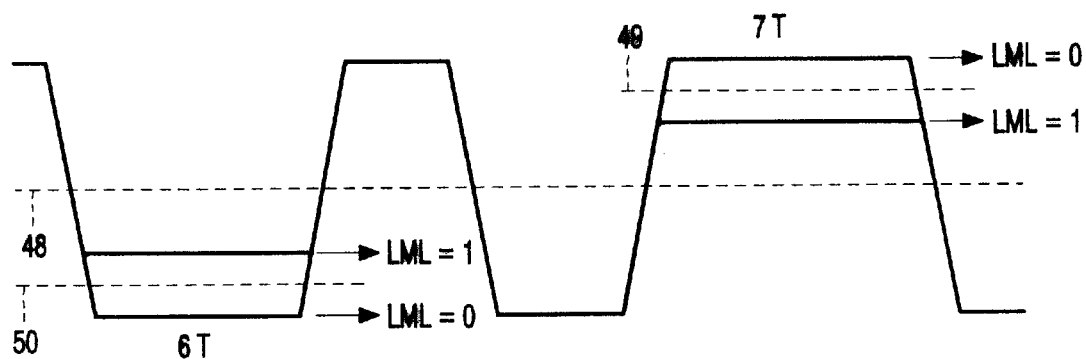
FIG. 3 shows an embodiment of the detection of the secondary channel.

FIG. 3 shows an embodiment of the detection of the secondary channel. Secondary channel detection is performed on the basis of the signal waveform and checks, via a slicer operating on the amplitude e.g. in the middle of the run, if runs have the secondary channel amplitude effect or not. One stores the information of the secondary channel effect on all runs on a symbol-by-symbol basis (for symbols of a length equal to n channel bits). One could also decide just to store this information for all runs ranging from an $I(n_{min}-1)$ and larger, if single-bit transition shifts are the main error source in the main channel. The storage on a symbol-by-symbol basis is needed in order to avoid problems with missing runs in the main channel, i.e. short runlengths of which the signal waveform does not reach beyond the slicer level of the main channel, which can occur with low probability.

For runlengths 6T and 7T it is indicated how the secondary/LML bits are detected. The dashed line 49 indicates the LML-land slicer level used for detecting the secondary/LML-land bits. The dashed line 50 indicates the LML-pit slicer level used for detecting the secondary/LML-pit bits. Depending on the detection with these slicer levels 49 and 50, the character of the LML-bit is indicated by LML=0 or LML=1. The slicer levels 49 and 50 are used to decide whether runs have the secondary channel amplitude effect or not.

Figure 2B:
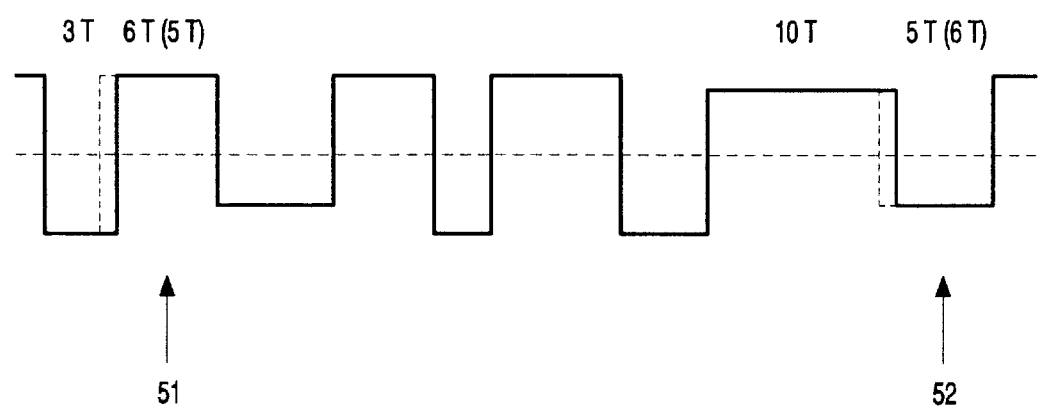

FIG. 2b shows the principle of LML-bit insertion and LML-bit deletion. Arrow 51 indicates the presence of LML-bit insertion as the original runlength 5T from FIG. 2a is detected as a 6T runlength. In this case, a bit insertion takes place when an I5 is turned into an I6 during RLL detection if for the parameter $n_{min}$ is $n_{min}$=6. Arrow 52 indicates the presence of LML-bit deletion as the original runlength 6T from FIG. 2a is detected as a 5T runlength. In this case, a bit deletion takes place when an I6 is turned into an I5 during RLL detection if for the parameter $n_{min}$ is $n_{min}$=6.

Figure 4:
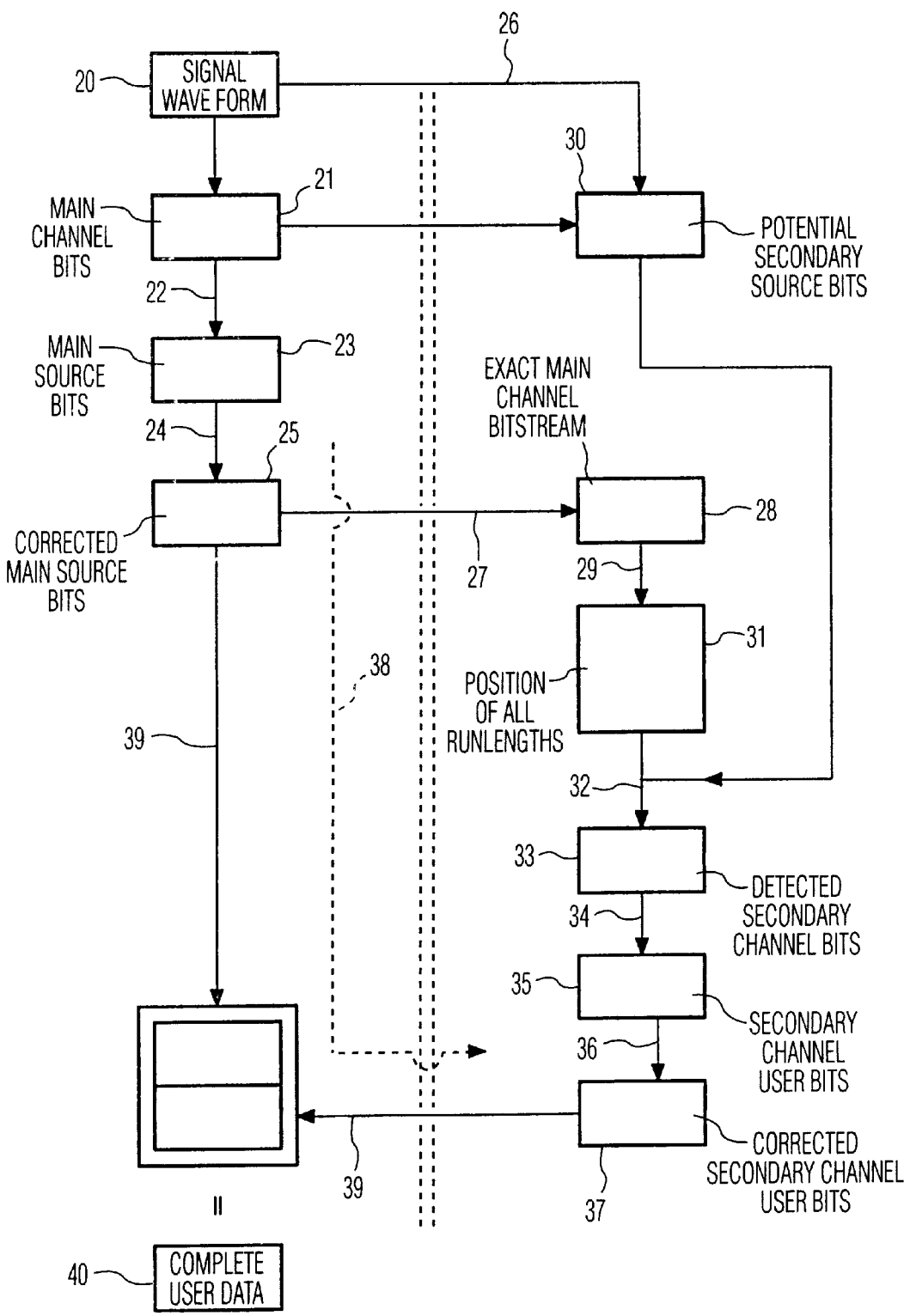
FIG. 4 shows an embodiment of a decoding method according to the invention.

The solution to the above problem of bitslips is described in FIG. 4. It shows an embodiment of a decoding method according to the invention. The main channel bits are detected from the signal waveform 20. The method of decoding the main channel bits into the main user bits is just the standard one, well known to a person skilled in the art: in step 22, the main channel bits 21 are decoded into the main source bits 23, in step 24, the error-correction is applied on the main source bits 23, which yields the corrected main source bits 25. These corrected main source bits 25 comprise user data plus parities.

In this embodiment of a decoding method according to the invention, the detection of the secondary channel requires the following: In step 26, secondary channel detection is accomplished. During the detection of the main channel, channel errors may lead to erroneous runlengths in the main channel bitstream, i.e. detected runlengths may be different from encoded runlengths. Therefore it is first assumed that each runlength carries a potential secondary channel bit, and secondary channel detection is performed on each runlength. Note that an actual secondary channel bit is detected only if the encoded runlength is not smaller than $In_{min}$. In step 26, secondary channel detection is performed on the basis of the signal waveform and checks, via a slicer operating on the amplitude in the middle of the run, if runs have the secondary channel amplitude effect or not (i.e. if a potential LML bit has value 1 or 0). One stores the information of the secondary channel effect on all runs on a symbol-by-symbol basis in block 30. One could also decide just to store this information for all runs ranging from an $I(n_{min}-1)$ and larger if single-bit transition shifts are the main error source in the main channel. The storage on a symbol-by-symbol basis is needed in order to avoid problems with missing runs, i.e. short runlengths of which the signal waveform does not reach beyond the slicer level of the main channel.

After error correction of the main channel in step 24, the corrected main source bits 25 are re-encoded in step 27, yielding the exact main channel bitstream 28. In step 29, this exact main channel bitstream 28 is used to yield the correct position of all runs in the main channel bit stream and is shown in block 31. In step 32, this exact knowledge of the occurrence of the long runlengths, stored in block 31, is combined with the secondary channel info about potential secondary channel bits, stored in block 30, which yields the detected secondary channel bits 33. In step 34, decoding of the secondary channel yields the secondary channel user bits 35. In step 36, traditional error correction of the secondary channel finally yields the corrected secondary channel user bits 37. In step 39, the secondary channel user data 37 are combined with the user data of the main channel 25 (i.e. the corrected-main source bits), to reassemble the complete user data 40. Also in this step 39, the parities are removed.

The embodiment as described above is to be considered as one example to which the decoding method according to the invention is applicable. The error correction of the secondary channel (step 36) can be improved via information generated during the error correction of the main channel (step 24). This is indicated by the dashed line 38. E.g. information about burst errors generated from the main channel error correction can be used as erasure information for the error correction of the secondary channel.

As an example, some characteristics of applying this method according to the invention are given. For a maxentropic d=2, k=10 RLL sequence, the extra capacity available in the secondary/LML channel for $In_{min}=6$ amounts to 11.5% on average. For sufficiently long data sequences, the distribution of the extra capacity in the secondary/LML channel becomes very narrow. For a complete sector of 64 kb, a capacity of 11.3% can practically always be guaranteed (probability of $1-10^{-15}$), i.e. the probability that it cannot be guaranteed is smaller than the miscorrection probability of the error correction coding (ECC) (probability of $10^{-12}$) to be discussed. If the same overhead for ECC applies to both main/RLL and secondary/LML channels, then only the overhead for the channel coding of the secondary/LML-source bits is to be taken into account.

The LML-channel code is essentially a DC-free d=0 code which allows enabling slicer control on the additional amplitude levels in pits and lands. Even for the low-rate 8-to-9 d=0 code (with an overhead of 12.5%; see U.S. Pat. No. 5,642,113 (PHN 14789)) a final capacity increase of about 10.0% is achievable on top of the capacity of the RLL channel.

In addition to this, scramblers may be used for accommodating a balance between short and long runlengths which may be useful for a steady sensitivity of the tracking servos (radial push-pull). Besides, to achieve full capacity, a scrambler may be used to guarantee the capacity of the secondary/LML channel.

Figure 5:
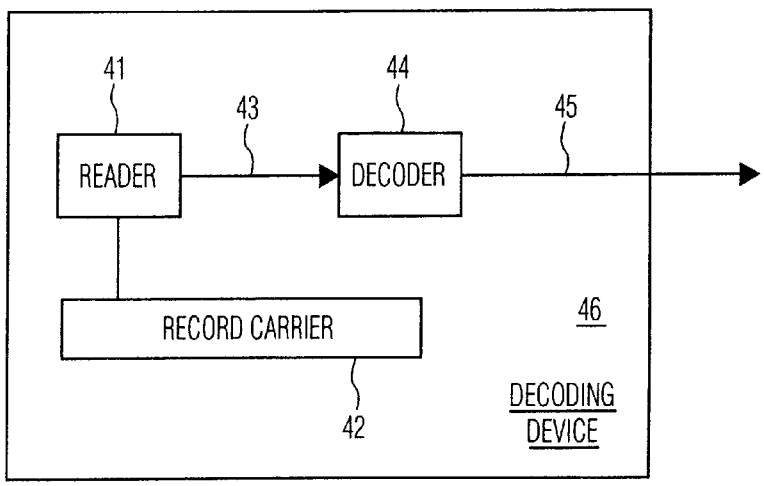
FIG. 5 shows an embodiment of a decoding device according to the invention.

FIG. 5 shows an embodiment of a decoding device 46 according to the invention. The device comprises reading means 41 for reading a record carrier 42, e.g. a DVD-ROM. These reading means 41 comprise an optical system for generating a focused light spot on the record carrier 42 and a detector for detecting the reflected light spot. The reading means 41 produce a stream of bits of a signal relating to a binary channel 43. This stream of bits of a signal relating to a binary channel 43 is decoded in a decoder 44 into a stream of bits of a signal relating to a binary source 45. The decoder 44 comprises standard means for decoding a RLL channel code, e.g. $(EFM^+)^{-1}$ and means for error correction, e.g. CIRC-correction, both well known to a person skilled in the art. The decoder 44 further comprises means for decoding a secondary channel in accordance with the method according to the invention. The stream of bits of a signal relating to a binary source 45 is outputted by the device 46 and can be further processed, e.g. for playing audio information, or for screening video information.

Figure 7:
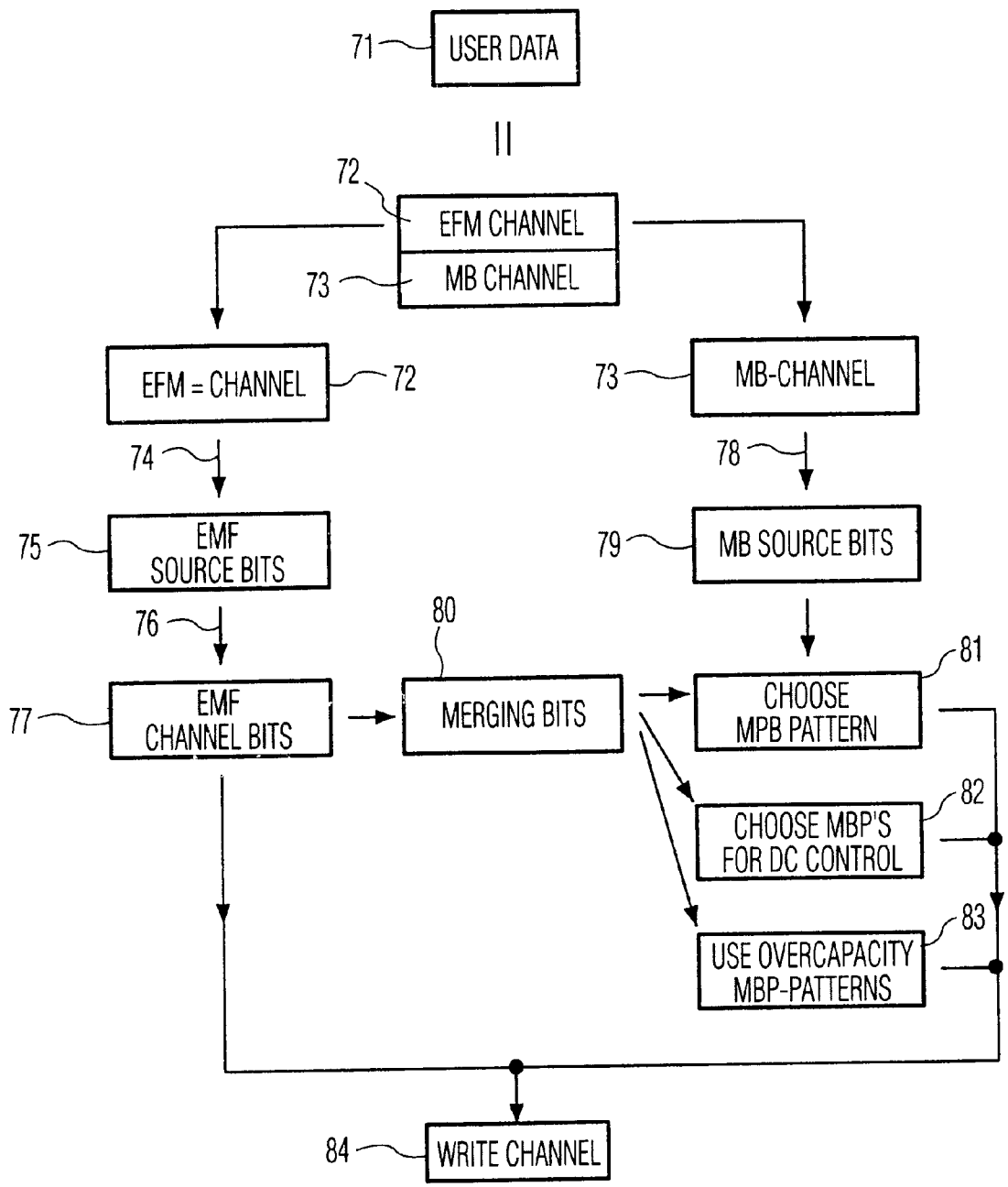
FIG. 7 shows an embodiment of a method for encoding of encoding a secondary channel via merging-bit coding.

The addition of a different secondary channel will be explained with reference to FIGS. 6 and 7. This secondary channel is called the merging-bit channel. In the EFM channel code as used for CD (see UK Patent Application GB 2 083 322 (PHQ 80007)), 8 source bits are encoded to 14 channel bits+3 merging bits. The function of the merging bits can, among others, be: (I) to prevent violations of the runlength constraints d=2 and k=10; (II) to provide a means for DC-control via the available freedom in the choice of the merging bits.

At maximum (dependent on EFM-Word 1 and EFM-Word 2), there are 4 possible choices for the merging bits:

000
100
010
001

DC-control is possible at the merging bits if more than one pattern is allowed. DC-control is most effective if pattern 1 "000" and at least one out of the other patterns 2,3 and 4 are allowed. In this way, the sign of the contribution (disparity) to the running digital sum (RDS) of the word after the merging bits can be controlled, so that the one with the lowest absolute value of the RDS can be chosen.

The effective rate of the EFM code is 8/17=0.4706, which is not optimal, considering the theoretical capacity for d=2, k=10 to be 0.5418.

To provide robust decoding of the secondary channel embedded via merging-bit coding (also called the merging-bit channel) a measure similar to the measure for preventing bit-slips in the LML-channel can be used for the merging-bit channel as will be explained below. In using the merging-bit pattern for creating extra capacity, part of the freedom that is offered in the choice of the merging bits is used. Some of the merging-bit patterns (MBPs) will be used for DC-control, the others will be used for the generation of extra capacity. The strategy in the choice of the merging-bit patterns (MBPs) will be explained in relation to the table of FIG. 6, which is set up in terms of the number of trailing zeroes (given by n)–$10^n$| of the previous 14-bit EFM-word (before the merging bits), and the number of leading zeroes (given by m) |$0^m$1-of the present 14-bit EFM-word (after the merging bits). Note that the notation $0^n$ implies a sequence of n consecutive zeroes.

In FIG. 6 the marks in the table refer to different classes of merging bit patterns (MBPs), and have the following meaning:

X: just a single choice possible for the merging bit pattern (MBP);

2: two possible choices for the MBP, both with a single 1 inside;

3: three possible choices for the MBP, all three with a single 1 inside;
4: all four choices for the MBP are possible;
H3: three possible choices for the MBP, one being the all-zero MBP;
DC: two possible choices for the MBP, one being the all-zero MBP.

For standard EFM coding, all locations of merging bits with more than one MBP possible (thus classes 2, 3, 4, H3 and DC) are used for DC-control.

In other to generate extra capacity, some of the MBPs are used to generate extra capacity in stead of for realizing DC-control. This is possible at locations where more than one MBP is possible. Since the two EFM words before and after the merging bits determine the number of MBPs that are possible, it is clear that the MB-channel is hierarchically dependent on the EFM channel. The MB-channel is thus a secondary channel, embedded into the EFM channel, and its use is of a stochastic nature since it depends on the data content of the main EFM channel.

In an embodiment a distinction is made between MBP-classes that are better to be used for DC-control, and classes that are better to be used for extra capacity in the MB-channel. A first observation in this respect is that DC-control is most effective if MBPs can be selected that have opposite parity. This implies that MBPs to be ideal for DC-control, should have at least two alternative patterns, one of which has to be the all-zero MBP. The MBP-classes that satisfy this condition are: 4, H3 and DC. The other classes 2 and 3 can thus better be used for generation of extra capacity of the add-on MB-channel. The last class X cannot be used for either of both purposes.

Now we consider more closely the MBP-classes that are optimal for DC-control, i.e. 4, H3 and DC. We note that the latter class (DC) yields the lowest extra capacity in terms of the number of possible alternative patterns, hence it is better to be used for DC-control. The opposite argumentation holds for the former class (4) which yields two bits of extra information at each location of a MBP of that class. Thus, this MBP-class can better be used for extra capacity of the add-on MB-channel. The other class (H3) is a somewhat intermediate class with respect to the above reasoning, in the sense that it generates either a control-point for DC-suppression, or a location in the MB-channel with $\log_2(3)=1.58$ bits of extra information. We have called this class H3, with the H referring to the hybrid character of this class. In a further embodiment that is presented, part of the class H3 will be used for DC-control, and the other part will be used for extra capacity in the MB-channel. Some MBPs are used for extra capacity if $6 \geq m \geq m_{min}$ or $6 \geq n \geq m_{min}$, while the other cases $2 \leq m \leq m_{min}$ or $2 \leq n < m_{min}$ are used for DC-control. The parameter $m_{min}$ will be varied between 2 and 6.

Resuming, as one possible embodiment, the following use of the different MBP-classes as follows is explained:
2,3,4: for the MB-channel;
DC: for DC-control;
X: no use at all;
H3: partly for the MB-channel, partly for DC-control.

The DC-control performance of EFM on which the merging-bit channel is added, is thus reduced. It must be noted that the selection of the hybrid class H3 is just one possible embodiment implementation of a "control knob" for selection between DC-control and extra capacity. Another implementation could be a timesharing on class 4, using the MBPs of class 4 at even locations for DC-control, and at odd locations for extra capacity.

A method for encoding is described below with reference to FIG. 7.

User data 71 is partitioned between the EFM-channel 72 (100%) and the MB-channel 73 (extra fraction f). ECC 74 is applied on the user data 72 of the EFM-channel, yielding source bits 75 (user data+parities). EFM encoding 76 yields the channel bits 77 of the EFM-channel, in words each of 14 channel bits. ECC 78 is applied on the user data 73 related to the MB-channel, yielding MB source bits 79 (user data+parities). After the EFM encoding 76, all EFM channel words are known, and a classification of each location of merging bits 80 can, for example, be done according to the table shown in FIG. 6. Then, it is clear where MBPs can be used for the MB-channel, and where MBPs are used for DC-control. At the former locations, a MBP pattern is chosen in 81 in accordance to the source bits of the MB-channel. Further, the MBPs used for DC-control are chosen in 82 according to a DC-control strategy based on the running digital sum (RDS). Then, all channel bits are uniquely specified, except from those MBP-patterns that are related to the overcapacity in the MB-channel. The overcapacity is due to the fact that the fraction f of capacity in the add-on MB-channel is chosen in such a way that it is quasi 100% guaranteed (8 $\sigma$ bound) for a MB-sector: a MB-sector is defined by its size in terms of EFM bytes. We have used an 8 $\sigma$ bound which implies a probability of around $10^{-16}$ that the capacity of the MB-channel will be insufficient for a given MB-sector size. The latter MBPs in the area of the overcapacity are used for DC-control in 83. Finally, when all MBPs are uniquely defined, the channel bit stream can be transferred to the write channel 84 (e.g. ROM mastering). The channel bit stream can than be written on any suitable information carrier, for example an optical record carrier.

It is essential for the decoding of the MB-channel that it is known which locations are used for the MB-channel, and how much extra information is coded at each location. For that purpose it is required that the MBP-class at each MBP-location can be uniquely and unambiguously specified. This is only possible if the two surrounding EFM channel words are known without any error. Therefore, an extra step is needed upon decoding as described in the next section. This step is similar to the decoding step described for decoding the LML-channel (see FIG. 4).

The decoding of the EFM-channel together with the MB-channel is explained below.

Step 1: Subdivision of Channel Bits: After synchronization, the detected channel bits can be subdivided into channel bits related to the EFM channel words, and channel bits related to the merging bits.

Step 2: Regeneration of Correct EFM Channel Words: The EFM channel words are decoded according to the EFM table, are then error-corrected (ECC), so that the correct user data of the EFM-channel is regenerated. The error-corrected source bits of the EFM-channel are then re-encoded according to the EFM table, so that the original set of (corrected) EFM channel words is obtained.

Step 3: Determination of MBPs contributing to MB-Channel: The set of corrected EFM channel words specifies unambiguously the type of MBP at each location of merging bits, according to the above table. It is then uniquely specified where the channel bits of the MB-channel are located Step 4: Runlength Correction on MBPs: Runlength violations that occur upon concatenation of the corrected EFM channel words and the detected merging bits of the MB-channel are corrected for example via the standard principles of pseudo maximum-likelihood or runlength pushback detection. The resulting MBP-bits are called Runlength-Corrected "MB" Source Bits. An example of this kind of correction is:

| As-Detected: | 010 010 00 |
|---|---|
| EFM-Corrected | 001 010 00 |
| Runlength-Corrected | 001 001 00 |

A second problem is that upon correcting the EFM channel words, there can be a transition shift from one of the EFM-words into the merging bit pattern, or vice versa. No single transition can be lost in the detection of the overall RLL channel bit stream. The pattern of the MBP can be corrected based on this aspect. It is a variant of this kind of runlength correction, applied only on the merging bits of interest, and assisted by the error-correction on the EFM-channel. Two examples are listed below. The first one is a shift from the MBP into the preceding EFM word:

| As-Detected: | 000 100 00 |
|---|---|
| EFM-Corrected: | 001 100 00 |
| Runlength-Corrected: | 001 000 00 |

The second example concerns a shift from the preceding EFM-word into the MBP:

| As-Detected: | 001 000 00 |
|---|---|
| EFM-Corrected: | 000 000 00 |
| Runlength-Corrected: | 000 100 00 |

The runlength correction could be omitted. Once a difference is noticed between the as-detected EFM-words and the re-encoded correct EFM-words positioned before and after the merging bits, i.e. a difference in the last "1" and first "1" respectively, instead of considering a runlength correction as just described, one can pass erasure information to the ECC of the MB-channel for the MBPs before and after the EFM-word, as far as these MBPs are used for capacity in the MB-channel. However, Runlength-correction is quite successful in repairing the effect on the MBPs of single bit transition shift-errors that are the most probable error source for random errors.

Step 5: ECC on MB-Source Bits: The Runlength-Corrected "MB" source bits are further error-corrected (ECC), so that finally the corrected user bits of the MB-channel are obtained, which together with the user bits of the EFM-channel, reproduce the total set of user data. The error-correction of the "MB" source bits can make use of erasure information obtained from the error correction of the EFM-channel (dashed arrow in FIG. 3). When two successive EFM words have been identified to be badly detected, then the potential MB-bits related to the merging bits located between both EFM words are erased before the ECC of the MB-channel.

The extra capacity in the MB-channel is at maximum 0.67 bit (8.4%) per user byte, but then the DC-suppression is reduced with about 10 dB compared to EFM. For a reduction in DC-suppression of only 1 to 2 dB compared to EFMPlus, the extra capacity in the MB-channel is 0.40 bit (5.0%) per user byte. The extra capacity of the MB-channel is in practice determined by (i) the reduction in DC-control that can be tolerated, and (ii) the size of the MB-sector over which the MB-capacity has to be guaranteed.

When reading out an information carrier on which the channel bit stream comprising the merging-bit channel, the method of decoding, as described with reference to FIG. 4, and the decoding device, as described with reference to FIG. 5, can be used.

The information carrier on which the merging-bit channel is stored, a method of encoding for encoding a merging-bit channel as a secondary channel, and a device for encoding a merging-bit channel as a secondary channel, can also be used independent of the method of decoding the secondary channel embedded in a main channel.

While the invention has been described with reference to preferred embodiments thereof, it is to be understood that these are not limitative examples. Thus, various modifications may become apparent to those skilled in the art, without departing from the scope of the invention, as defined in the claims. For example, the two different kinds of secondary channels introduced here as an example, the LML-channel and the MB-channel, can be used separately to increase for example the capacity but can also be used together.

Furthermore, the invention lies in each and every novel feature or combination of features.

What is claimed is:

1. A method comprising:
   providing a stream of channel bits of a signal relating to a binary channel, the binary channel including a stream of main channel bits and a stream of secondary channel bits, the secondary channel being embedded in the main channel
   correcting errors in the stream of main channel bits
   correcting errors in the stream of secondary channel bits depending on the correcting of the stream of main channel bits.

2. The method of claim 1, in which the stream of corrected main channel bits is reconstructed from a stream of corrected source bits.

3. The method of claim 1, in which erasure information from the main channel is used for correcting errors in the stream of secondary channel bits of the binary channel relating to the secondary channel.

4. The method of claim 1, in which the secondary channel is embedded in the main channel via multi-level coding;
   the secondary channel is embedded in the main channel via merging-bit coding;
   the binary channel includes merging-bits forming merging-bit patterns of a first and of a second class, the merging-bit patterns of the first class are used for influencing a property of the binary channel, and the merging-bit patterns of the second class are used for creating the secondary channel;
   the multi-level coding is only applied for a predetermined minimum runlength;
   a physical parameter of a reconstructed signal corresponding to the stream of corrected main channel bits is used for correcting errors in the stream of secondary channel bits;
   the physical parameter is the runlength;
   the secondary channel is split up into a secondary pit channel and a secondary land channel;
   erasure information from the main channel is used for correcting errors in the stream of secondary channel bits of the binary channel relating to the secondary channel.

5. The method of claim 1, in which the secondary channel is split up into a secondary pit channel and a secondary land channel.

6. The method of claim 1, in which the secondary channel is embedded in the main channel using multi-level coding.

7. The method of claim 6, in which the multi-level coding is only applied for a predetermined minimum runlength.

8. The method of claim 1, in which the secondary channel is embedded in the main channel using merging-bit coding.

9. The method of claim 8, wherein the binary channel includes merging-bits forming merging-bit patterns of a first and of a second class, the merging-bit patterns of the first class are used for influencing a property of the binary channel, and the merging-bit patterns of the second class are used for creating the secondary channel.

10. The method of claim 1, in which a physical parameter of a reconstructed signal corresponding to the stream of corrected main channel bits is used for correcting errors in the stream of secondary channel bits.

11. The method of claim 10, in which the physical parameter is the runlength.

12. A device comprising:
an input for a stream of channel bits of a signal relating to a binary channel, the binary channel including a main channel and a secondary channel;
decoding means for decoding the main channel and producing a stream of corrected bits of the binary channel relating to the main channel and, for decoding the secondary channel and for correcting errors in the stream of bits of the binary channel relating to the secondary channel using the stream of corrected bits of the binary channel relating to the main channel;
means for combining the decoded main channel and the decoded and corrected secondary channel into a stream of source bits of a signal relating to a binary source; and
an output for the stream of source bits.

13. The device of claim 12, in which the secondary channel is embedded in the main channel using merging-bit coding.

14. The device of claim 12, in which the secondary channel is embedded in the main channel using multi-level coding.

15. The device of claim 12, in which the decoding means decode a multi-level coded binary channel, the multi-level coding only being applied for a predetermined minimum runlength.

16. The device of claim 12, in which the secondary channel is split up into a secondary pit channel and a secondary land channel.

17. The device of claim 12, in which erasure information from the main channel is used for correcting errors in the stream of bits of the binary channel relating to the secondary channel.

18. The device of claim 12, in which the device further comprises reading means for reading a record carrier.

19. The device of claim 12, in which:
the decoding means decode a multi-level coded binary channel, the multi-level coding only being applied for a predetermined minimum runlength;
the decoding means decode the secondary channel using a physical parameter of the stream of bits of the binary channel relating to the main channel for correcting errors in the stream of bits of the binary channel relating to the secondary channel;
the physical parameter is the runlength;
the secondary channel is split up into a secondary pit channel and a secondary land channel; and
erasure information from the main channel is used for correcting errors in the stream of bits of the binary channel relating to the secondary channel; and
the device further comprises reading means for reading a record carrier.

20. The device of claim 12, in which the decoding means decode the secondary channel using a physical parameter of the stream of bits of the binary channel relating to the main channel for correcting errors in the stream of bits of the binary channel relating to the secondary channel.

21. The device of claim 20, in which the physical parameter is the runlength.

22. A reader for reading a record carrier, comprising:
a read head for reading from a record carrier, a stream of channel bits of a signal relating to a binary channel, the binary channel including a main channel and a secondary channel;
main decoding means for decoding the main channel and producing a stream of corrected bits of the binary channel relating to the main channel;
secondary decoding means for decoding a secondary channel and for correcting errors in the stream of bits of the binary channel relating to the secondary channel using the stream of corrected bits of the binary channel relating to the main channel;
means for combining the decoded main channel and the decoded and corrected secondary channel into a stream of source bits of a signal relating to a binary source; and
an output for the stream of source bits.

23. The reader of claim 22, in which:
the decoding means decode a multi-level coded binary channel, the multi-level coding only being applied for a predetermined minimum runlength;
the decoding means decode the secondary channel using a physical parameter of the stream of bits of the binary channel relating to the main channel for correcting errors in the stream of bits of the binary channel relating to the secondary channel;
the physical parameter is the runlength;
the secondary channel is split up into a secondary pit channel and a secondary land channel; and
erasure information from the main channel is used for correcting errors in the stream of bits of the binary channel relating to the secondary channel.

* * * * *